United States Patent
Hsieh et al.

(10) Patent No.: US 9,053,288 B1
(45) Date of Patent: Jun. 9, 2015

(54) LAYOUT CHECKING SYSTEM FOR MULTIPLE-PATTERNING GROUP ASSIGNMENT CONSTRAINTS

(71) Applicant: TAIWAN SEMICONDUCTOR MANUFACTURING COMPANY, LTD., Hsinchu (TW)

(72) Inventors: Yao-Jen Hsieh, Taipei (TW); Kai-Ming Liu, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/231,273

(22) Filed: Mar. 31, 2014

(51) Int. Cl.
*G06F 17/50* (2006.01)

(52) U.S. Cl.
CPC .................. *G06F 17/5081* (2013.01)

(58) Field of Classification Search
CPC .................. G06F 17/30; G06F 17/50
USPC .......................................... 716/111
See application file for complete search history.

(56) References Cited

U.S. PATENT DOCUMENTS

| | | | |
|---|---|---|---|
| 2004/0002846 A1* | 1/2004 | Lutz et al. | 703/19 |
| 2007/0233404 A1* | 10/2007 | Lally et al. | 702/35 |
| 2010/0138801 A1* | 6/2010 | Matsuoka et al. | 716/6 |
| 2013/0132913 A1* | 5/2013 | Fu et al. | 716/51 |
| 2013/0205266 A1* | 8/2013 | Chen et al. | 716/55 |
| 2013/0254726 A1* | 9/2013 | Hsu et al. | 716/53 |
| 2013/0263065 A1* | 10/2013 | Chen et al. | 716/55 |
| 2014/0053118 A1* | 2/2014 | Chen et al. | 716/52 |
| 2014/0101623 A1* | 4/2014 | Chen et al. | 716/52 |

* cited by examiner

*Primary Examiner* — Thuan Do
*Assistant Examiner* — Mohammed Alam
(74) *Attorney, Agent, or Firm* — Lowe Hauptman & Ham, LLP (57) ABSTRACT

A method includes extracting multiple-patterning group assignment information of one or more layout patterns from a layout design. The layout design corresponds to a circuit design, and the one or more layout patterns corresponding to a node of the circuit design. Whether the extracted multiple-patterning group assignment information is consistent with a set of multiple-patterning group assignment constraints of the node is determined by a hardware processor.

19 Claims, 5 Drawing Sheets

```
                    ┌─────────────────────────────┐  300A
                    │ .subckt TOP D G S B         │
              310 ──┼─M1 D G S B nch W=3 L=1      │
                    │ .ends                       │
              320 ──┼─* D M1_A, M2_B              │
                    └─────────────────────────────┘
```

Fig. 3A

```
                    ┌─────────────────────────────┐  100
                    │ .subckt TOP D G S B         │
                    │ M1 D G S B nch W=3 L=1      │
                    │ .ends                       │
                    └─────────────────────────────┘

```
       ┌──────────────────────────────────────────────────────┐ 400A
  110──┼.subckt TOP D G S B                                   │
  410──┼─M1 D G S B nch W=3 L=1 │ D_m1=1 D_m2=2 ┼
  120──┼.ends                                                 │
       └──────────────────────────────────────────────────────┘
                                130              420
```

Fig. 4A

```
       ┌──────────────────────────────────────────────────────┐ 100
       │ .subckt TOP D G S B                                  │
       │ M1 D G S B nch W=3 L=1                               │
       │ .ends                                                │
       └──────────────────────────────────────────────────────┘

┌──────────────────────────────────────────────────────┐ 400B
       │ TOP/M1 D_m1=1 D_m2=2                                 │
       └──────────────────────────────────────────────────────┘
```

Fig. 4B

```
                              500A
        .subckt TOP D G S B
510 ─── M1 D G S B nch W=3 L=1
        .ends
        ─────────────────────────
        * D  M1_A, M2_B
520 ─── * G  M1_A
        * S  M2_B
```

Fig. 5A

```
                                                                          500B
530 ── .subckt TOP D G S B
550 ── M1 D G S B nch W=3 L=1 | D_m1=1 D_m2=2 S_m1=2 G_m1=1
540 ── .ends
                          552                              554
```

LAYOUT CHECKING SYSTEM FOR MULTIPLE-PATTERNING GROUP ASSIGNMENT CONSTRAINTS

BACKGROUND

In semiconductor fabrication processes, a single layer of features is sometimes formed by using multiple-patterning technology to improve a spatial resolution of the layer. For example, if a layer of features is to be fabricated using N-patterning processes, N being a positive integer no less than 2, layout patterns for the layer of features are assigned to N different groups for corresponding patterning processes. The pattern-assigning process is sometimes performed by a circuit designer or a layout designer manually assigning the layout patterns to different groups, by executing a software program in a manner similar to resolving a coloring problem under graph theory, or a combination thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In some multiple-patterning applications, because of the tolerance of misalignment of various masks and process variations, one of the groups of a particular layer of features is adjusted to be closer to the averaged performance despite the variations than the other groups. Therefore, in some instances a circuit designer or a layout designer preferentially assigns one or more layout patterns to a group that is least affected by the variations in order to have a more predictable performance. In some applications, the circuit designer or the layout designer preferentially specifically assign layout patterns to different groups for various reasons such as improved pattern density or reduced mismatch among corresponding features. In some embodiments, the preference for assigning one or more layout patterns to one or more particular groups are stored as a set of multiple-patterning group assignment constraints in this disclosure.

In some embodiments, the method, software program, and system in accordance with the present disclosure checks if multiple-patterning group assignment information extracted from a layout design is consistent with the set of multiple-patterning group assignment constraints.

Figure 1A:
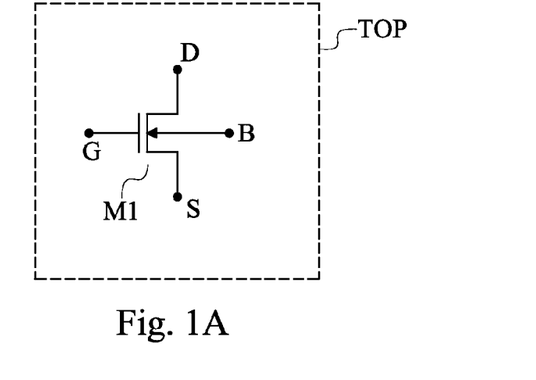
FIG. 1A is a schematic diagram of a circuit design in accordance with some embodiments.
Figure 1B:
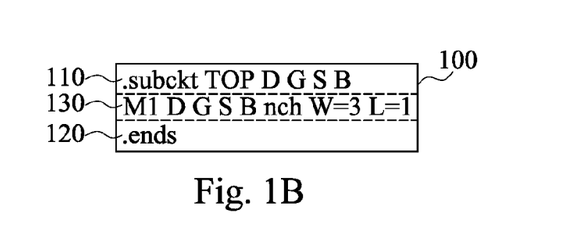
FIG. 1B is a diagram of a coding portion representing the circuit design of FIG. 1A in a netlist file in accordance with some embodiments.
Figure 2:
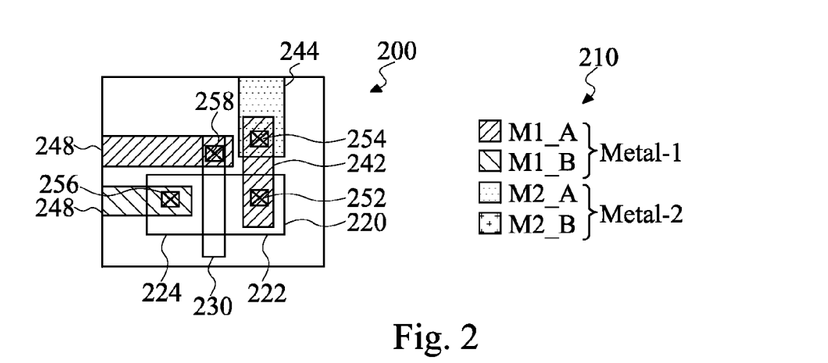
FIG. 2 is a layout diagram depicting a layout design of the circuit design of FIG. 1A in accordance with some embodiments.
Figure 4A:
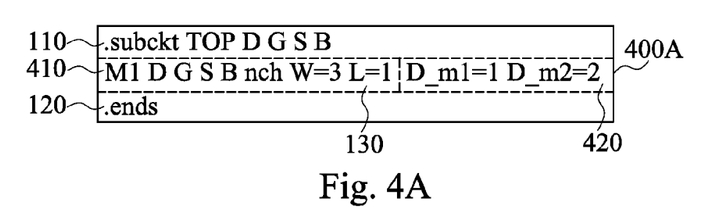
FIG. 4A is a diagram of a coding portion of another modified netlist file in accordance with some embodiments.
Figure 4B:
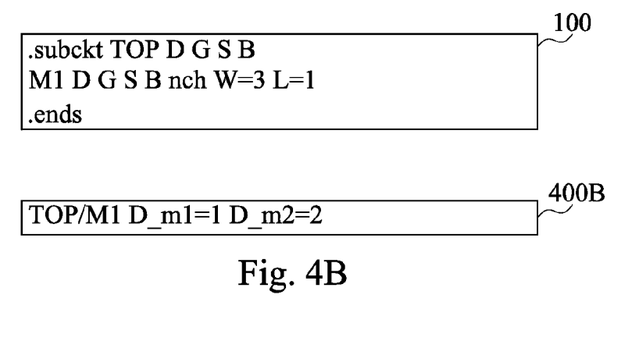
FIG. 4B is a diagram of a coding portion of a netlist file and a supplemental file in accordance with some embodiments.
Figure 5A:
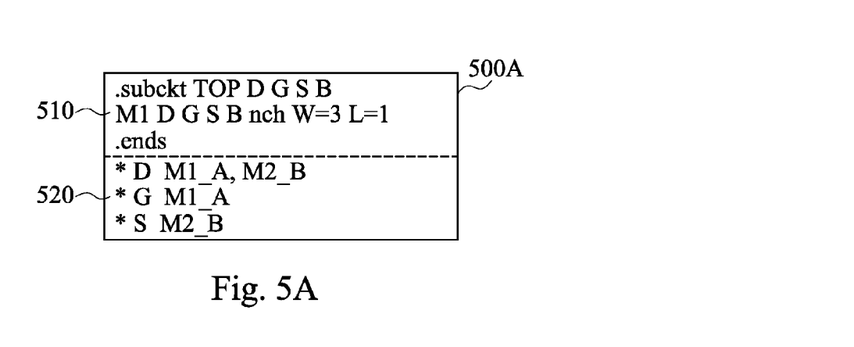
FIG. 5A is a diagram of a coding portion of extracted multiple-patterning group assignment in a file of a netlist format in accordance with some embodiments.
Figure 5B:
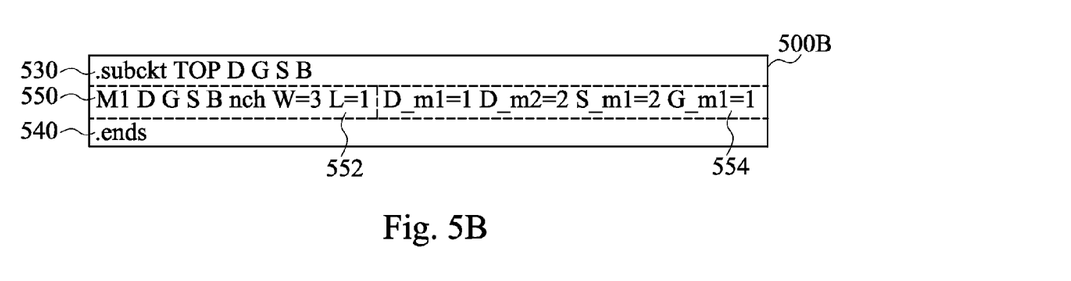
FIG. 5B is a diagram of a coding portion of extracted multiple-patterning group assignment in a file of a netlist format in accordance with some embodiments.
Figure 5C:
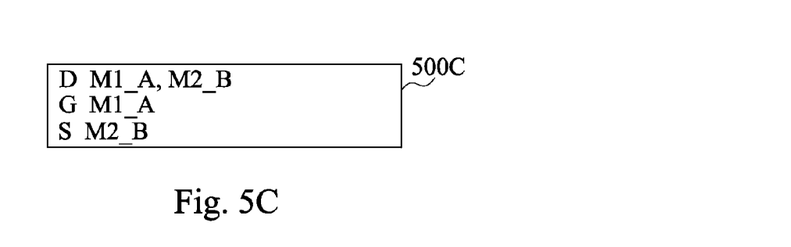
FIG. 5C is a diagram of a coding portion of extracted multiple-patterning group assignment in a file of a proprietary format in accordance with some embodiments.
Figure 6:
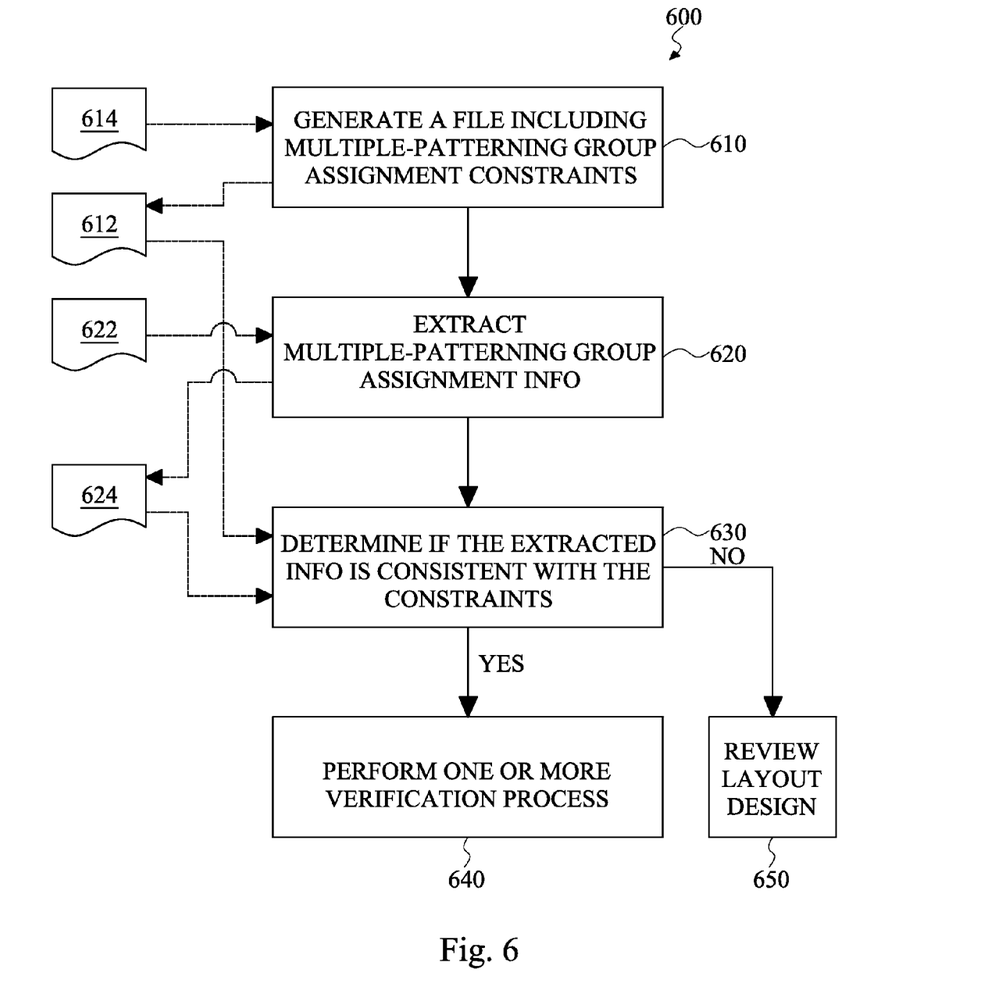
FIG. 6 is a flow chart of a method of checking a layout design based on a set of multiple-patterning group assignment constraints in accordance with some embodiments.

An example circuit design TOP depicted in FIGS. 1A, 1B, and 2 and various example files depicted in FIGS. 3A-5C are introduced to facilitate the illustration of the method as depicted in FIG. 6. The method as depicted in FIG. 6 is applicable to an integrated circuit design having various active electrical components, passive electrical components, and/or interconnection structures. The method as depicted in FIG. 6 is applicable to layout pattern assignment under a double-patterning process or an N-patterning process, where N is a positive integer no less than 2.

FIG. 1A is a schematic diagram of a circuit design TOP in accordance with some embodiments. Circuit design TOP includes an N-type transistor M1 and four terminals defined as nodes D, G, S, and B. In some embodiments, node D corresponds to the drain of transistor M1; node G corresponds to the gate of transistor M1; node S corresponds to the source of transistor M1; and node B corresponds to the bulk of transistor M1.

FIG. 1B is a diagram of a coding portion representing the circuit design TOP in FIG. 1A in a netlist file 100 in accordance with some embodiments. The contents of the netlist file 100 are in compliance with a predetermined type of netlist syntax, such as BERKELEY SPICE syntax or HSPICE syntax. In some embodiments, the predetermined type of netlist syntax is a type of syntax that is usable to record a circuit design in a descriptive format recognizable by a predetermined circuit design system.

Netlist file 100 includes a beginning line 110, an ending line 120, and a description section 130. The beginning line 110, using the statement ".subckt", and the ending line 120, using the statement ".ends", declare a circuit block identified as "TOP" and corresponding nodes D, G, S, and B thereof. Description section 130 further declares that circuit design TOP includes an N-type transistor (using the parameter "nch") and its connections and characteristics.

FIG. 2 is a layout diagram depicting a layout design 200 of the circuit design TOP of FIG. 1A with legend 210 in accordance with some embodiments. In some embodiments, a layout design for circuit design TOP has different arrangements with different layers of materials and layout patterns.

Layout design 200 includes layout patterns for an oxide definition (OD) region 220, a gate region 230, interconnection structures 242, 244, 246, and 248, and via plugs 252, 254, 256, and 258. Gate layout pattern 230 corresponds to the gate of transistor M1 (FIGS. 1A and 1B). Gate layout pattern 230 divides OD layout pattern 220 into two portions 222 and 224. Portion 222 corresponds to the drain of transistor M1, and portion 224 corresponds to the source of transistor M1.

Interconnection layout pattern 242 overlaps with portion 222 of OD layout pattern 220 and via plug layout pattern 252; interconnection layout pattern 244 overlaps with interconnection layout pattern 242 and via plug layout pattern 254; interconnection layout pattern 246 overlaps with portion 224 of OD layout pattern 220 and via plug layout pattern 256; and interconnection layout pattern 248 overlaps with gate layout pattern 230 and via plug layout pattern 258. Interconnection layout patterns 242 and 244 and via plug layout patterns 252 and 254 are usable to form interconnection structures electrically connected to the drain of transistor M1. Interconnection layout pattern 246 and via plug layout pattern 256 are usable to form interconnection structures electrically connected to the source of transistor M1. Interconnection layout pattern 248 and via plug layout pattern 258 are usable to form interconnection structures electrically connected to the gate of transistor M1.

Two interconnection layers, named Metal-1 and Metal-2, are being used to implement interconnection structures based on interconnection layout patterns 242, 244, 246, and 248. The two interconnection layers will be fabricated using double-patterning technology. Each interconnection layer Metal-1 or Metal-2 is formed based on two separate groups of layout patterns. For example, layout patterns for interconnection layer Metal-1 are assigned to group M1_A or group M1_B; and layout patterns for interconnection layer Metal-2 are assigned to group M2_A or group M2_B. In some embodiments, group M1_A and group M1_B are mutually exclusive, and group M2_A and group M2_B are mutually exclusive. For example, if a layout pattern of interconnection layer Metal-1 is assigned to group M1_A, that particular layout pattern cannot be assigned to group M1_B, and vice versa.

As illustrated by the legend 210, interconnection layout patterns 242 and 248 are assigned to group M1_A; interconnection layout pattern 246 is assigned to group M1_B; and interconnection layout pattern 244 is assigned to group M2_A. In this particular example, no layout pattern is assigned to group M2_B.

In some embodiments, the multiple-patterning group assignment in a layout design 200, as depicted in FIG. 2, is also determined based on a set of multiple-patterning group assignment constraints provided by a circuit designer or a layout designer. In some embodiments, the set of multiple-patterning group assignment constraints is determined independent from the multiple-patterning group assignment in a layout design 200. The set of multiple-patterning group assignment constraints specifies how the layout patterns of one or more particular nodes of the circuit design TOP would be assigned. In some embodiments, the set of multiple-patterning group assignment constraints includes to what groups the layout patterns of a particular node are to be assigned.

Figure 3A:
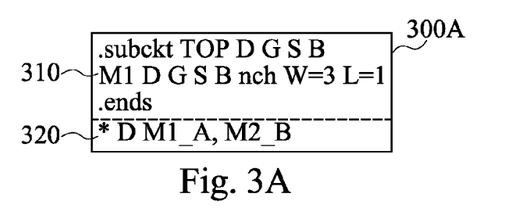
FIG. 3A is a diagram of a coding portion of a modified netlist file in accordance with some embodiments.

FIG. 3A is a diagram of a coding portion of a modified netlist file 300A in accordance with some embodiments. The components that are the same or similar to those in FIG. 1B and FIG. 2 are given the same reference numbers.

Modified netlist file 300A is prepared based on netlist file 100 (FIG. 1B) and includes a first portion 310 and a second portion 320. The first portion 310 has the contents of the netlist file 100, and the second portion 320 has the set of multiple-patterning group assignment constraints. For example, in the embodiment depicted in FIG. 3A, the set of multiple-patterning group assignment constraints specifies that layout patterns corresponding to node D would include at least one layout pattern assigned to group M1_A and at least another one layout pattern assigned to group M2 B.

In some embodiments, the contents of the netlist file 100 and the contents of the modified netlist file 300A are in compliance with a predetermined type of netlist syntax, such as BERKELEY SPICE syntax or HSPICE syntax. In some embodiments, the second portion of the modified netlist 300A is in compliance with a comment format of the predetermined type of netlist syntax.

Figure 3B:
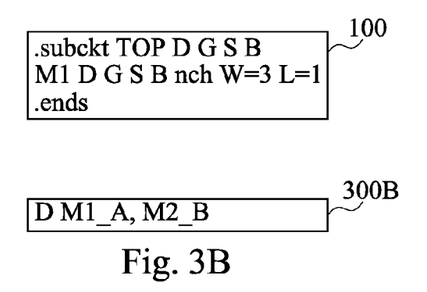
FIG. 3B is a diagram of a coding portion of a netlist file and a supplemental file in accordance with some embodiments.

FIG. 3B is a diagram of a coding portion of a netlist file 100 and a supplemental file 300B in accordance with some embodiments. Compared with the embodiment of FIG. 3A, the set of multiple-patterning group assignment constraints is stored in the supplemental file 300B different from the netlist file 100. In some embodiments, the contents of the supplemental file 300B are in compliance with the predetermined type of netlist syntax. In some embodiments, the contents of the supplemental file 300B are in compliance with a proprietary syntax recognizable by the system 700 illustrated in conjunction with FIG. 7.

FIG. 4A is a diagram of a coding portion of another modified netlist file 400A in accordance with some embodiments. The components that are the same or similar to those in FIG. 1B and FIG. 2 are given the same reference numbers.

Modified netlist file 400A is prepared based on netlist file 100 (FIG. 1B) and includes beginning line 110, ending line 120, and a modified description section 410. Modified description section 410 includes a first portion 130 consistent with description section 130 and a second portion 420. The second portion 420 has the set of multiple-patterning group assignment constraints. Compared with modified netlist file 300A, the set of multiple-patterning group assignment constraints in second portion 420 is in compliance with a parameter format of the predetermined type of netlist syntax.

For example, the variables D_m1 and D_m2 in second portion 420 are predefined in the file 400A or in the predetermined type of netlist syntax. The values for variables D_m1 and D_m2 are also predefined to represent various groups to which the layout patterns of corresponding node or nodes will be assigned. For example, in the embodiment depicted in FIG. 4A, the set of multiple-patterning group assignment constraints specifies that layout patterns corresponding to node D would include at least one layout pattern assigned to group M1_A (as indicated by D_m1=1) and at least another one layout pattern assigned to group M2_B (as indicated by D_m1=2).

FIG. 4B is a diagram of a coding portion of a netlist file 100 and a supplemental file 400B in accordance with some embodiments. Compared with the embodiment of FIG. 4A, the set of multiple-patterning group assignment constraints is stored in the supplemental file 400B different from the netlist file 100. In some embodiments, the contents of the supplemental file 400B are in compliance with the predetermined type of netlist syntax. In some embodiments, the contents of the supplemental file 400B are in compliance with a parameter format of the predetermined type of netlist syntax.

Moreover, in some embodiments, the multiple-patterning group assignment information of one or more layout patterns of layout design 200 is extracted from the layout design 200. FIGS. 5A-5C depict some embodiments of storing the extracted multiple-patterning group assignment information.

FIG. 5A is a diagram of a coding portion of extracted multiple-patterning group assignment in a file 500A of a netlist format in accordance with some embodiments. File 500A includes a first portion 510 and a second portion 520. First portion 510 includes the netlist of the circuit design as extracted from the layout design 200. Second portion 520 includes the extracted multiple-patterning group assignment information in compliance with a comment format of a predetermined type of netlist syntax.

For example, in the embodiment depicted in FIG. 5A, the extracted multiple-patterning group assignment information indicates that layout pattern(s) corresponding to node D are assigned to group M1_A and group M2_B, layout pattern(s) corresponding to node G are assigned to group M1_A, and layout patterns corresponding to node S are assigned to group M2_B.

FIG. 5B is a diagram of a coding portion of extracted multiple-patterning group assignment in a file 500B of a netlist format in accordance with some embodiments. File 500B includes beginning line 530, ending line 540, and a description section 550. Description section 550 further includes a first portion 552 and a second portion 554. Beginning line 530, ending line 540, and first portion 552 constitute a majority of a netlist of the circuit design as extracted from the layout design 200. The second portion 554 includes the extracted multiple-patterning group assignment information in compliance with a parameter format of a predetermined type of netlist syntax.

FIG. 5C is a diagram of a coding portion of extracted multiple-patterning group assignment information in a file 500C of a proprietary format in accordance with some embodiments.

FIG. 6 is a flow chart of a method 600 of checking a layout design based on a set of multiple-patterning group assignment constraints in accordance with some embodiments. FIG. 6 will be illustrated in conjunction with the examples depicted in FIGS. 1A-5C. It is understood that additional operations may be performed before, during, and/or after the method 600 depicted in FIG. 6, and that some other processes may only be briefly described herein.

The process begins with operation 610, where a file 612 that includes a set of multiple-patterning group assignment constraints for a circuit design 614 is generated. In some embodiments, circuit design 614 corresponds to circuit design TOP and is accessible in a form of a netlist file, such as netlist file 100 in FIG. 1B. In some embodiments, file 612 is part of a modified netlist file, such as modified netlist file 300A or 400A. In some embodiments, file 612 is a supplemental file different from the netlist file 100, such as supplemental file 300B or 400B.

The process proceeds to operation 620, where multiple-patterning group assignment information 624 of one or more layout patterns is extracted from a layout design 622. The layout design 622 corresponds to circuit design 614, and the one or more layout patterns correspond to one or more nodes of the circuit design 614. In some embodiments, the extracted multiple-patterning group assignment information 624 is stored in a file, such as file 500A, 500B, or 500C.

In some embodiments, layout design 622 is generated based on circuit design 614 and the file 612 that includes the set of multiple-patterning group assignment constraints after operation 610. In some embodiments, layout design 622 is generated based on circuit design 614 without benefiting from the set of multiple-patterning group assignment constraints.

The process proceeds to operation 630, where a system, such as system 700, determines if the extracted multiple-patterning group assignment information 624 is consistent with the set of multiple-patterning group assignment constraints 612. In some embodiments when the set of multiple-patterning group assignment constraints 612 is stored in a modified netlist file, such as file 300A or 400A, operation 630 further includes parsing the second portion of the modified netlist based on a comment format of the predetermined type of netlist syntax or based on a parameter format of the predetermined type of netlist syntax. In some embodiments when the set of multiple-patterning group assignment constraints 612 is stored in a supplemental file, such as file 300B or 400B, operation 630 further includes parsing the supplemental file based on a proprietary format, a comment format of the predetermined type of netlist syntax, or a parameter format of the predetermined type of netlist syntax.

In some embodiments, in operation 630, a message indicating a result of the determining operation is generated. In some embodiments, the message is a message displayed on a monitor, an audio warning signal, a part of a log file, or a combination thereof.

Furthermore, if the system determines that the extracted multiple-patterning group assignment information 624 is consistent with the set of multiple-patterning group assignment constraints 612, the process proceeds to operation 640, where one or more verification processes are performed. In some embodiments, operation 640 includes one or more layout-dependent verification process, such as resistance-capacitance extraction and post-layout simulation.

On the other hand, if the system determines that the extracted multiple-patterning group assignment information 624 is inconsistent with the set of multiple-patterning group assignment constraints 612, the process proceeds to operation 650. After being notified with the result, a circuit designer or a layout designer reviews and revises the layout design 622. In some embodiments, after the layout design 622 is modified, the process goes back to operations 620 to extract the multiple-patterning group assignment information from the updated layout design 622. In some embodiments, instead of revising the layout design, the circuit designer or the layout designer determines that the inconsistency is acceptable and the process proceeds to operation 640.

In some embodiments, the process stops after notifying the user whether the extracted multiple-patterning group assignment information 624 is consistent with the set of multiple-patterning group assignment constraints 612. Thus, operations 640 and 650 are omitted.

Figure 7:
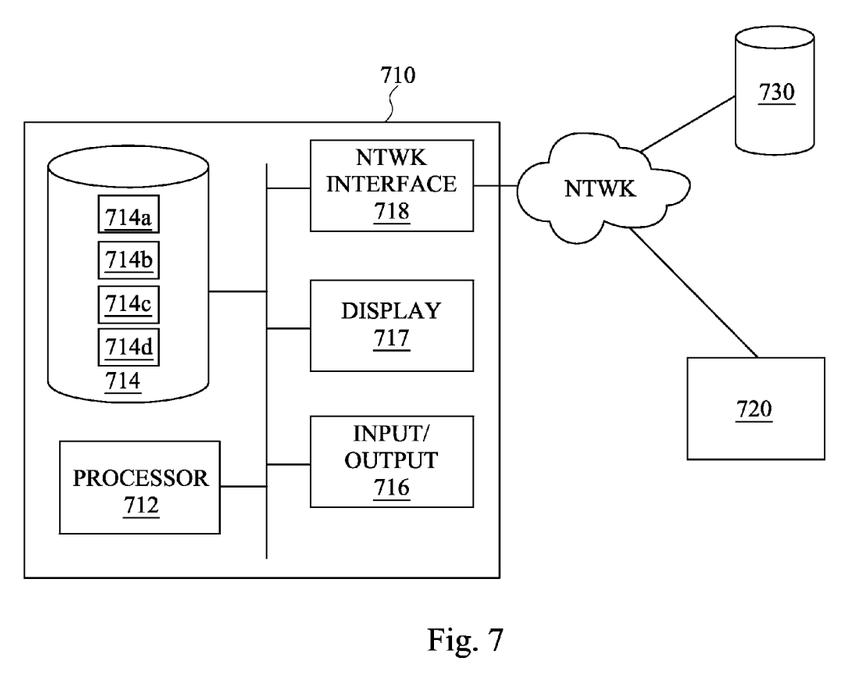
FIG. 7 is a functional block diagram of a layout checking system in accordance with one or more embodiments.

FIG. 7 is a functional block diagram of a layout checking system 700 in accordance with one or more embodiments. Layout checking system 700 includes a first computer system 710, a second computer system 720, a networked storage device 730, and a network 740 connecting the first computer system 710, the second computer system 720, and the networked storage device 730. In some embodiments, one or more of the second computer system 720, the storage device 730, and the network 740 are omitted.

The first computer system 710 includes a hardware processor 712 communicatively coupled with a non-transitory, computer readable storage medium 714 encoded with, i.e., storing, a set of instructions 714a, a circuit design 714b, a layout design 714c, or any intermediate data 714d (e.g., the extracted multiple-patterning group assignment information 612 or the set of multiple patterning group assignment constraints 624)

for executing the set of instructions 714a. The processing unit 712 is electrically and communicatively coupled with the computer readable storage medium 714. The processing unit 712 is configured to execute the set of instructions 714a encoded in the computer readable storage medium 714 in order to cause the computer 710 to be usable as a layout checking tool for performing a method as described in conjunction with FIG. 6.

In some embodiments, the set of instructions 714a, the circuit design 714b, the layout design 714c, or the intermediate data 714d are stored in a non-transitory storage medium other than storage medium 714. In some embodiments, some or all of the set of instructions 714a, the circuit design 714b, the layout design 714c, or the intermediate data 714d are stored in a non-transitory storage medium in networked storage device 730 or second computer system 720. In such case, some or all of the set of instructions 714a, the circuit design 714b, the layout design 714c, or the intermediate data 714d stored outside computer 710 is accessible by the processing unit 712 through the network 740.

In some embodiments, the processor 712 is a central processing unit (CPU), a multi-processor, a distributed processing system, an application specific integrated circuit (ASIC), and/or a suitable processing unit.

In some embodiments, the computer readable storage medium 714 is an electronic, magnetic, optical, electromagnetic, infrared, and/or a semiconductor system (or apparatus or device). For example, the computer readable storage medium 714 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 714 includes a compact disk-read only memory (CD-ROM), a compact disk-read/write (CD-R/W), and/or a digital video disc (DVD).

The computer system 710 includes, in at least some embodiments, an input/output interface 716 and a display unit 717. The input/output interface 716 is coupled to the processor 712 and allows the circuit designer to manipulate the first computer system 710. In at least some embodiments, the display unit 717 displays the status of executing the set of instructions 714a and, in at least some embodiments, provides a Graphical User Interface (GUI). In at least some embodiments, the display unit 717 displays the status of executing the set of instructions 714a in a real time manner. In at least some embodiments, the input/output interface 716 and the display 717 allow an operator to operate the computer system 710 in an interactive manner.

In at least some embodiments, the computer system 700 also includes a network interface 718 coupled to the processor 712. The network interface 718 allows the computer system 710 to communicate with the network 740, to which one or more other computer systems are connected. The network interface includes wireless network interfaces such as BLUETOOTH, WIFI, WIMAX, GPRS, or WCDMA; or wired network interface such as ETHERNET, USB, or IEEE-1394.

In accordance with some embodiments, checking checks if multiple-patterning group assignment information extracted from a layout design is consistent with the set of multiple-patterning group assignment constraints is performed by an automated system or tool. Hence, compared with manually checking the layout design, the checking method and apparatus as described in the present disclosure helps to streamline the layout and post-layout verification process when one or more layers of features are to be fabricated using the multiple-patterning technology.

In accordance with one embodiment, a method includes extracting multiple-patterning group assignment information of one or more layout patterns from a layout design. The layout design corresponds to a circuit design, and the one or more layout patterns corresponding to a node of the circuit design. Whether the extracted multiple-patterning group assignment information is consistent with a set of multiple-patterning group assignment constraints of the node is determined by a hardware processor.

In accordance with another embodiment, a layout checking system includes a non-transitory storage medium encoded with a set of instructions and a hardware processor communicatively coupled with the non-transitory storage medium. The hardware processor is configured to execute the set of instruction to extract multiple-patterning group assignment information of one or more layout patterns from a layout design and to determine if the extracted multiple-patterning group assignment information is consistent with a set of multiple-patterning group assignment constraints of a node. The layout design corresponds to a circuit design, and the one or more layout patterns correspond to the node of the circuit design.

In accordance with another embodiment, a non-transitory storage medium encoded with a set of instructions. The set of instructions is configured to cause a hardware processor to perform a method comprising: extracting multiple-patterning group assignment information of one or more layout patterns from a layout design; and determining if the extracted multiple-patterning group assignment information is consistent with a set of multiple-patterning group assignment constraints of a nod. The layout design corresponds to a circuit design, and the one or more layout patterns correspond to a node of the circuit design.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    extracting multiple-patterning group assignment information of one or more layout patterns from a layout design, the layout design corresponding to a circuit design, and the one or more layout patterns corresponding to a node of the circuit design, wherein the circuit design is accessible in a form of a netlist file;
    determining, by a hardware processor, if the extracted multiple-patterning group assignment information is consistent with a set of multiple-patterning group assignment constraints of the node; and
    extracting the set of multiple-patterning group assignment constraints from a modified netlist file, the modified netlist file comprising a first portion having contents of the netlist file and a second portion having the set of multiple-patterning group assignment constraints.

2. The method of claim 1, further comprising:
    performing one or more layout-dependent verification processes after a determination that the extracted multiple-patterning group assignment information is consistent with the set of multiple-patterning group assignment constraints.

3. The method of claim 1, further comprising:
generating a message indicating a result of the determining if the extracted multiple-patterning group assignment information is consistent with the set of multiple-patterning group assignment constraints.

4. The method of claim 1, wherein
the contents of the netlist file and the contents of the modified netlist file are in compliance with a predetermined type of netlist syntax; and
the extracting the set of multiple-patterning group assignment constraints comprises parsing the second portion of the modified netlist based on a comment format of the predetermined type of netlist syntax.

5. The method of claim 1, wherein
the contents of the netlist file and the contents of the modified netlist file are in compliance with a predetermined type of netlist syntax; and
the extracting the set of multiple-patterning group assignment constraints comprises parsing the second portion of the modified netlist based on a parameter format of the predetermined type of netlist syntax.

6. The method of claim 1, further comprising:
generating the layout design based on the circuit design and the set of multiple-patterning group assignment constraints.

7. A layout checking system, comprising:
a non-transitory storage medium encoded with a set of instructions;
a hardware processor communicatively coupled with the non-transitory storage medium and configured to execute the set of instruction to:
   extract multiple-patterning group assignment information of one or more layout patterns from a layout design, the layout design corresponding to a circuit design, and the one or more layout patterns corresponding to a node of the circuit design, wherein the circuit design is accessible in a form of a netlist file;
   determine if the extracted multiple-patterning group assignment information is consistent with a set of multiple-patterning group assignment constraints of the node; and
   extract the set of multiple-patterning group assignment constraints from a modified netlist file, the modified netlist file comprising a first portion having contents of the netlist file and a second portion having the set of multiple-patterning group assignment constraints.

8. The layout checking system of claim 7, wherein
the contents of the netlist file and the contents of the modified netlist file are in compliance with a predetermined type of netlist syntax; and
the second portion of the modified netlist is in compliance with a comment format of the predetermined type of netlist syntax.

9. The layout checking system of claim 7, wherein
the contents of the netlist file and the contents of the modified netlist file are in compliance with a predetermined type of netlist syntax; and
the second portion of the modified netlist is in compliance with a parameter format of the predetermined type of netlist syntax.

10. A non-transitory storage medium encoded with a set of instructions, the set of instructions is configured to cause a hardware processor to perform a method comprising:
extracting multiple-patterning group assignment information of one or more layout patterns from a layout design, the layout design corresponding to a circuit design, and the one or more layout patterns corresponding to a node of the circuit design, wherein the circuit design is accessible in a form of a netlist file;
determining if the extracted multiple-patterning group assignment information is consistent with a set of multiple-patterning group assignment constraints of the node; and
extracting the set of multiple-patterning group assignment constraints from a modified netlist file, the modified netlist file comprising a first portion having contents of the netlist file and a second portion having the set of multiple-patterning group assignment constraints.

11. The non-transitory storage medium of claim 10, wherein
the contents of the netlist file and the contents of the modified netlist file are in compliance with a predetermined type of netlist syntax; and
the extracting the set of multiple-patterning group assignment constraints comprises parsing the second portion of the modified netlist based on a comment format of the predetermined type of netlist syntax.

12. The non-transitory storage medium of claim 10, wherein
the contents of the netlist file and the contents of the modified netlist file are in compliance with a predetermined type of netlist syntax; and
the extracting the set of multiple-patterning group assignment constraints comprises parsing the second portion of the modified netlist based on a parameter format of the predetermined type of netlist syntax.

13. The method of claim 1, wherein
the contents of the netlist file and are in compliance with a predetermined type of netlist syntax; and
the predetermined type of netlist syntax comprises BERKELEY SPICE syntax or HSPICE syntax.

14. A method, comprising:
extracting multiple-patterning group assignment information of one or more layout patterns from a layout design, the layout design corresponding to a circuit design, and the one or more layout patterns corresponding to a node of the circuit design, wherein the circuit design is accessible in a form of a netlist file;
determining, by a hardware processor, if the extracted multiple-patterning group assignment information is consistent with a set of multiple-patterning group assignment constraints of the node; and
extracting the set of multiple-patterning group assignment constraints from a supplemental file different from the netlist file, wherein the extracting the set of multiple-patterning group assignment constraints from the supplemental file comprises parsing the supplemental file based on a predetermined type of netlist syntax or proprietary syntax.

15. The method of claim 14, wherein the contents of the netlist file are in compliance with the predetermined type of netlist syntax.

16. A layout checking system, comprising:
a non-transitory storage medium encoded with a set of instructions;
a hardware processor communicatively coupled with the non-transitory storage medium and configured to execute the set of instruction to:
   extract multiple-patterning group assignment information of one or more layout patterns from a layout design, the layout design corresponding to a circuit design, and the one or more layout patterns corresponding to a node of the circuit design, wherein the circuit design is accessible in a form of a netlist file;

determine if the extracted multiple-patterning group assignment information is consistent with a set of multiple-patterning group assignment constraints of the node; and extract the set of multiple-patterning group assignment constraints from a supplemental file different from the netlist file by parsing the supplemental file based on a predetermined type of netlist syntax or proprietary syntax.

17. The layout checking system of claim 16, wherein the contents of the netlist file are in compliance with the predetermined type of netlist syntax.

18. A non-transitory storage medium encoded with a set of instructions, the set of instructions is configured to cause a hardware processor to perform a method comprising:

extracting multiple-patterning group assignment information of one or more layout patterns from a layout design, the layout design corresponding to a circuit design, and the one or more layout patterns corresponding to a node of the circuit design, wherein the circuit design is accessible in a form of a netlist file;

extracting the set of multiple-patterning group assignment constraints from a supplemental file different from the netlist file; and determining if the extracted multiple-patterning group assignment information is consistent with a set of multiple-patterning group assignment constraints of the node;

wherein the extracting the set of multiple-patterning group assignment constraints from the supplemental file comprises parsing the supplemental file based on a predetermined type of netlist syntax or proprietary syntax.

19. The non-transitory storage medium of claim 18, wherein the contents of the netlist file are in compliance with the predetermined type of netlist syntax.

* * * * *